United States Patent [19]
Lefevre et al.

[11] Patent Number: 5,181,078
[45] Date of Patent: Jan. 19, 1993

[54] FIBER OPTIC MEASURING DEVICE, RATE GYRO, NAVIGATION AND STABILIZATION SYSTEM, AND CURRENT SENSOR

[75] Inventors: Hervé Lefevre, Paris; Philippe Martin, Fresnes, both of France

[73] Assignee: Photonetics S.A., France

[21] Appl. No.: 685,682

[22] Filed: Apr. 16, 1991

[30] Foreign Application Priority Data

Apr. 17, 1990 [FR] France .................. 90 04908

[51] Int. Cl.$^5$ ............................................. G01C 19/72
[52] U.S. Cl. ................................................... 356/350
[58] Field of Search ........................ 356/350, 349; 250/227.27, 227.19

[56] References Cited

U.S. PATENT DOCUMENTS

| | | | |
|---|---|---|---|
| 4,299,490 | 11/1981 | Cahill | 356/350 |
| 4,705,399 | 11/1987 | Graindorge et al. | 356/350 |
| 5,056,919 | 10/1991 | Arditty et al. | 356/350 |
| 5,116,127 | 5/1992 | Gröllman | 356/350 |
| 5,116,129 | 5/1992 | Ishigami | 356/350 |
| 5,123,741 | 6/1992 | Spahlinger | 356/350 |

FOREIGN PATENT DOCUMENTS

0168292  3/1986  European Pat. Off. .
2555739  4/1987  France .

Primary Examiner—Samuel A. Turner
Assistant Examiner—Richard E. Kurtz, II
Attorney, Agent, or Firm—Mason, Fenwick & Lawrence

[57] ABSTRACT

A fiber optic measuring device can be used, for example, as a rate gyro. Variation in a measured parameters engenders a phase difference between two waves. The measuring device includes a light source 1, a SAGNAC ring interferometer 2, a detector 3, a phase modulator 4, and a electronic unit 7. The electronic unit 7 includes a processing system 9 which furnishes a signal that is a function of the measured parameter and an electronic sub-unit 12 for controlling the phase modulator 4. The control signal for the modulator is a superposition of a first, periodic gating, bias signal $\Phi_b(t)$ with period $2\tau$ and amplitude $\Phi_{bm}$, and of a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$. $\Phi_{bm}$ and $\Phi_{mm}$ are slaved to $2\Phi_{bm}+\Phi_{mm}=2n\pi$ (where n is an integer). The response to the singular phase shift introduced during the fall-back of the negative-feedback signal is for this slaving and hence is used to keep the gain of the modulation chain constant.

10 Claims, 4 Drawing Sheets

FIBER OPTIC MEASURING DEVICE, RATE GYRO, NAVIGATION AND STABILIZATION SYSTEM, AND CURRENT SENSOR

FIELD OF THE INVENTION

The invention relates to a fiber optic measuring device enabling measurement of the variation in a parameter which produces non-reciprocal perturbations in a SAGNAC ring interferometer.

The SAGNAC interferometer and the physical phenomena which it involves are well known. In such an interferometer a splitting plate or other splitting device divides an incident wave. The two counter-propagating waves thus created propagate in opposite directions along a closed optical path, recombine and produce interference which depends on the phase shift in the waves when they recombine.

Originally, the closed optical path of SAGNAC interferometers was defined by mirrors. It is now known that it may be constituted by a multi-turn, monomode fiber optic coil.

It is also known that certain physical phenomena are able to produce perturbations, particularly non-reciprocal phase shifts, on counter-propagating waves, engendering a relative phase shift in these waves, which modify their state of interference when they recombine.

The measurement of this relative phase shift enables the phenomenon which engenders it to be quantified.

PRIOR ART

The principal physical phenomenon able to create these non-reciprocal perturbations is the SAGNAC effect produced by the rotation of the interferometer relative to an axis perpendicular to the plane of its closed optical path. The Faraday effect or colinear magneto-optic effect is likewise known to produce non-reciprocal effects of this type; this has for example been described in an article in the journal OPTIC LETTERS (Vol. 7, no. 4, Apr. 1982, pages 180–182) by K. BOHM. Under certain conditions, other effects can likewise produce a non-reciprocal phase shift.

By contrast, variations in numerous parameters representative of the environment which are often the origin of perturbations in the measurements have only reciprocal effects on the SAGNAC interferometer, do not perturb the relative phase shift between the counter-propagating waves, and hence have no influence on the measurement of the parameter studied. Such is the case for the slow variations of temperature, indices, etc. which modify the optical path traversed by the waves, but modify it in a reicprocal manner.

Much work has been conducted in order to improve the sensitivity and accuracy of the measurements able to be performed with such a measuring apparatus. As regards this topic, it will for example be possible to consult chapter 9 entitled "Fiber Optic Gyroscope" by Hervé C. Lefévre, in the work "Optical Fiber Sensors" Vol. 2, ARTECH HOUSE, 1989.

In particular, it has firstly been observed that the response furnished by the SAGNAC interferometer is of the form $P = P_0(1 + \cos \delta\Phi)$ and hence that the sensitivity of this signal in the neighborhood of the phase difference $\delta\Phi = 0$, is low. It has been proposed to introduce a squared phase difference modulation, with amplitude more or less $\pi/2$ for example which displaces the operating point and produces a periodic signal the amplitude of which is a sinusoidal function of the measured parameter, and which can hence be exploited with greater sensitivity and stability.

It was later shown that the accuracy of the measurement is improved by the use of a zero method, also called closed-loop operation. According to this method, an additional so-called negative-feedback phase difference $\delta\Phi_{cr}$ is applied, and serves to compensate for the phase difference $\delta\Phi_p$ produced by the measured parameter. The sum of these two phase differences $\delta\Phi_{cr}$ and $\delta\Phi_p$ is kept null, this enabling the interferometer to be operated with maximum accuracy. The measurement is performed by exploiting the signal necessary for producing the negative-feedback phase difference $\delta\Phi_{cr}$. Thus, the measurement is stable and linear.

The slaving necessary for this closed-loop operation can be performed through a frequency offset. This offset can be generated directly on the basis of acousto-optic modulators, or else simulated by applying a serrodyne modulation to a phase modulator. Such a serrodyne modulation is produced by applying a saw tooth phase modulating ramp. Regarding this topic, U.S. Pat. No. 4,299,490 can for example be consulted. It is known however that this requires a well-regulated fall-back of $2\alpha\pi$ (where $\alpha$ is an integer) in order to prevent parasitic sidebands. However, exploitation of the signal after fall-backs makes it possible to produce the regulation of the value of the fall-back in order to ensure high accuracy in the measurement. It is also known that a continuous ramp can be replaced by steps synchronized on a clock and that such a signal can be generated on the basis of a logic circuit and a digital-analog converter.

In order to improve the sensitivity and accuracy of the measurement, it has moreover been proposed to digitize the signal on output from the detector. The electronic processing means then comprise an analog-digital converter, a digital processing system exploiting the signal furnished by the analog-digital converter bringing back the component thereof at the modulation frequency about the continuous. A servo-loop digital filter fed by the signal leaving the digital processing system furnishes a signal representing the measured parameter. A register receiving the signal leaving the servo-loop digital filter furnishes a signal which is a function of the measured parameter for any desired external use. An accumulator fed by the signal leaving the register generates a digital ramp the slope of which is a function of the measured parameter, and a digital-analog converter fed by the ramp signal issuing from the accumulator, controls the phase modulator.

The aim of the present invention is to improve the sensitivity and stability of a fiber optic measuring device whilst yet limiting the dynamic of the modulation, thus permitting, for the same performance, a decrease in the power supplied to the modulator and hence a reduction in the parasitic thermal dissipation which accompanies it. It is likewise an objective of the invention to propose such a device in which the gain in the negative-feedback modulation control chain is kept constant. To this effect, the signals produced during the fall-back of the phase ramp are used.

SUMMARY OF THE INVENTION

The invention relates to a fiber optic measuring device in which the variation in the measured parameter engenders a phase difference between two waves, comprising a quasi-monochromatic light source, a, preferably monomode, SAGNAC ring interferometer in which two counter-propagating waves propagate, the propagation time of the waves between their splitting and their recombining being $\tau$, a detector, a phase modulator, and electronic means comprising a processing system furnishing a signal which is a function of the measured parameter and electronic means controlling the phase modulator.

According to the invention, the control signal for the modulator is the superposition of a first, periodic gating, bias signal generating a phase shift $\Phi_b(t)$ of period $2\tau$ and amplitude $\Phi_{bm}$, and a second, staircase, negative-feedback signal generating a phase shift $\Phi_m(t)$ each step of which has a duration equal to $\tau$ or to one of its submultiples, and an amplitude $\Phi_s$, which is a function of the value of the measured parameter and which falls back from $\Phi_{mm}$ when its amplitude exceeds a predetermined threshold, $\Phi_{bm}$ and $\Phi_{mm}$ being related by the relationship $2\Phi_{bm}+\Phi_{mm}=2n\pi$ where n is an integer, the response to the singular phase shift introduced during the fall-back of the negative-feedback signal being used to keep the gain of the modulation chain constant. These phase shifts $\Phi_b(t)$ and $\Phi_m(t)$ are generated by a phase modulator placed at the end of the coil and hence creating phase differences between the 2 counter-propagating waves, respectively equal to $\delta\Phi_b(t)=\Phi_b(t)-\Phi_b(t-\tau)$ and $\delta\Phi_m(t)=\Phi_m(t)-\Phi_m(t-\tau)$ which add together.

The electronic means for processing the signal are digital and comprise an analog-digital converter intended to digitize the signal generated by the detector, a digital processing system exploiting the signal furnished by the analog-digital converter, a servo-loop digital filter fed by the signal leaving the digital processing system and furnishing a signal representing the measured parameter, a register receiving the signal leaving the servo-loop digital filter and furnishing a signal which is a function of the measured parameter for any desired external use, an accumulator generating the steps on the basis of the signal from the register, a modulation generator producing a modulating signal, an adder comprising two inputs and one output, its first input being fed by the signal which is a function of the measured parameter produced by the register and the accumulator, its second input being fed by the bias modulating signal, a digital-analog converter fed by the output signal from the adder and controlling the phase modulator.

BRIEF DESCRIPTION OF THE DRAWINGS

The invention will be described in detail with reference to the drawings in which:

FIG. 3 represents the first, periodic gating signal $\Phi_b(t)$ (3A), and the second, staircase signal $\Phi_m(t)$ (3B), which are used to control the modulator.

FIG. 4 represents the phase difference $\delta\Phi(t)$ (4C) produced in the interferometer by the superposition of $\delta\Phi_b(t)$ (4B) and $\delta\Phi_m(t)$ (4A) in a first embodiment.

FIG. 5 represents the phase difference $\delta\Phi(t)$ (5C) produced in the interferometer by the superposition of $\delta\Phi_b(t)$ (5B) and $\delta\Phi_m(t)$ (5A) in a second embodiment.

DESCRIPTION OF THE PREFERRED EMBODIMENT

Figure 1:
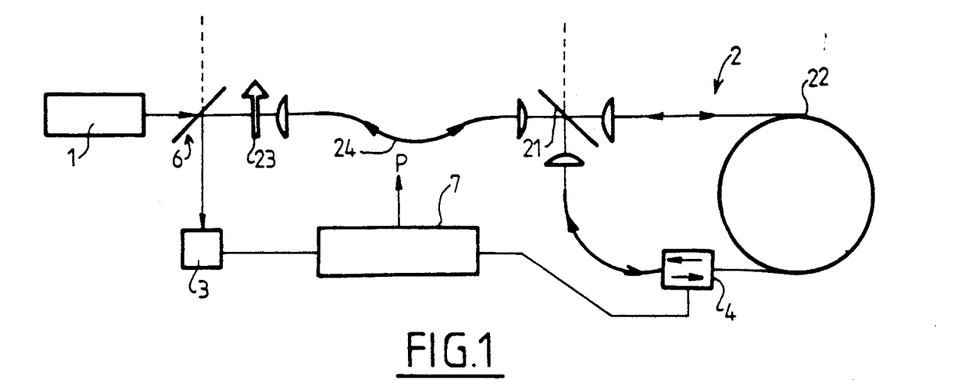
FIG. 1 is a general representation of the measuring device of the invention.

The fiber optic measuring device of the invention comprises a quasi-monochromatic light source 1 which is most often a laser or a super-luminescent diode, and a monomode fiber optic SAGNAC ring interferometer, designated overall by the reference 2.

This ring interferometer 2 comprises a splitting plate 21 splitting the waves at the input of the interferometer, then their recombining at the output, and a closed optical path 22 constituted by a monomode optical fiber wound around itself. The propagation time of the waves between their splitting and their recombining is $\tau$.

This measuring device likewise comprises a detector 3 furnishing a signal which is a function of the state of interference of the waves at the output of the interferometer itself.

The optical signal is furnished to the detector 3 via a splitter 6 for example constituted by a semi-transparent plate.

At one of the ends of the optical path of the interferometer there is interposed a modulator 4 which, controlled on the basis of an electrical signal, generates a phase shift $\Phi(t)$ which is able to introduce a phase difference $\delta\Phi(t)=\Phi(t)-\Phi(t-\tau)$ between the two waves. The operation of the interferometer is improved by interposing a polarizer 23 and a spatial filter 24 between the light source 1 and the entrance of the ring 22, that is to say the splitting plate 21. In a known manner, this spatial filter is constituted by a monomode optical fiber.

Digital electronic means 7 negative-feedback control the phase modulator 4 as a function of the signal received from the detector 3.

These digital electronic means 7 are configured so that the variation in the demodulated error signal as a function of the difference in step produced between the two waves in the neighborhood of zero is approximately linear. This arrangement makes it possible to obtain a very high sensitivity of the variation in the demodulated error signal in the neighborhood of the zero in the step difference, whilst it is readily appreciated that when the dependency of the signal on the step difference is of cosine form, the sensitivity in the zero neighborhood of the step difference is very low. This is obtained by applying a bias modulating signal $\Phi_b(t)$ to the control signal for the phase modulator. The signal is a periodic gating signal with period equal to $2\tau$ and maximum amplitude $\Phi_{bm}$.

The function of the digital electronic means 7 is likewise to keep the step difference null. That is to say that when the variation in the measured parameter introduced a phase difference between the two waves in the interferometer this difference produces a variation in the signal emitted by the detector 3 provoking, via the digital electronic means 7 and the phase modulator 4, an action which is equal and oppositely directed to the phase shift produced initially, so that the overall phase difference is brought back to the null value.

For this purpose, the electronic means 7 generate a staircase negative-feedback signal $\Phi_m(t)$. Each step has a duration equal to $\tau$ or to one of its sub-multiples and an amplitude $\Phi_s$ which is a function of the value of the measured parameter. It falls back from the value $\Phi_{mm}$ when its amplitude exceeds a predetermined threshold.

The bias modulating signal $\Phi_b(t)$ and the negative-feedback modulating signal $\Phi_m(t)$ are next superimposed in order to control the phase modulator 4. The fall-back of the negative-feedback modulating signal $\Phi_m(t)$ is hence produced before its superposition with the bias modulating signal $\Phi_b(t)$.

It has been observed that it is particularly advantageous to connect the parameters $\Phi_{bm}$ and $\Phi_{mm}$ by the relationship $2\Phi_{bm}+\Phi_{mm}=2n\pi$. The measurement thus obtained is particularly stable and the fall-back of the negative-feedback signal is advantageously used to keep the gain of the modulating chain constant without it being necessary for the dynamic of the measurement to be large.

Finally, these digital electronic means 7 furnish, by exploiting the control signal $\Phi_m(t)+\Phi_b(t)$ for the phase modulator 4, a signal which is a function of the variation in the measured parameter.

The propagation time of the waves between their splitting and their recombining is $\tau$.

Figure 2:
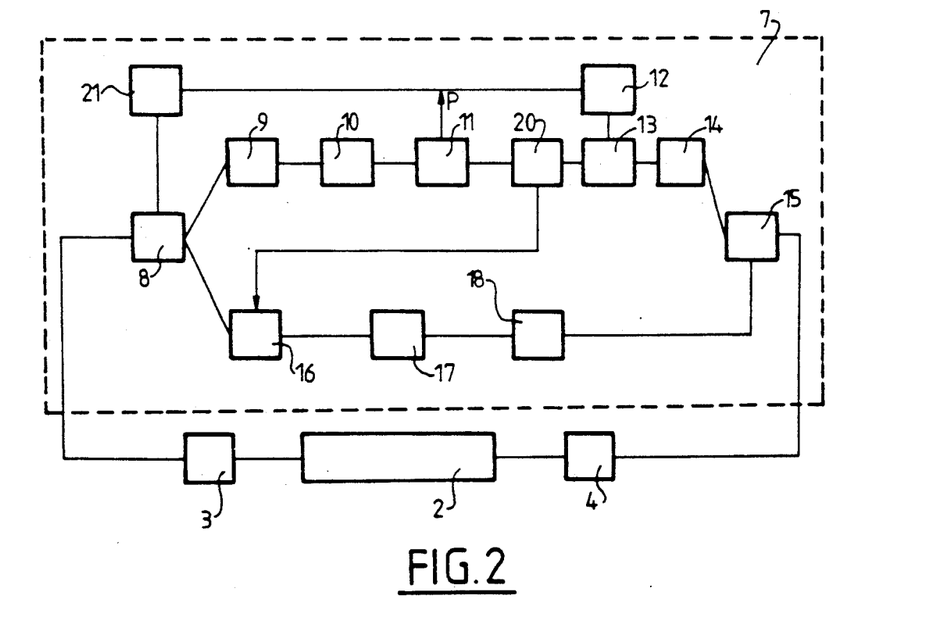
FIG. 2 is a block diagram representing the signal processing.
Figure 3A:
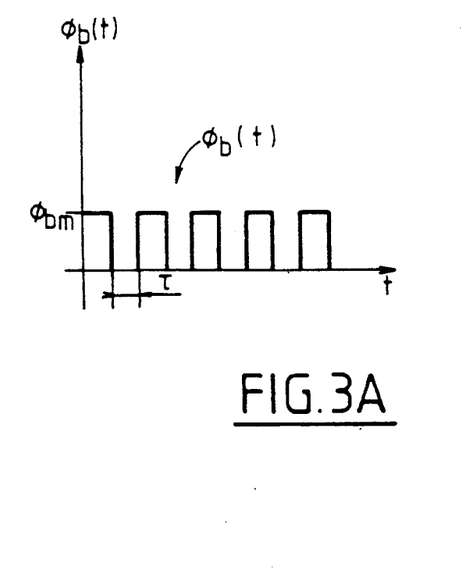
Figure 3B:
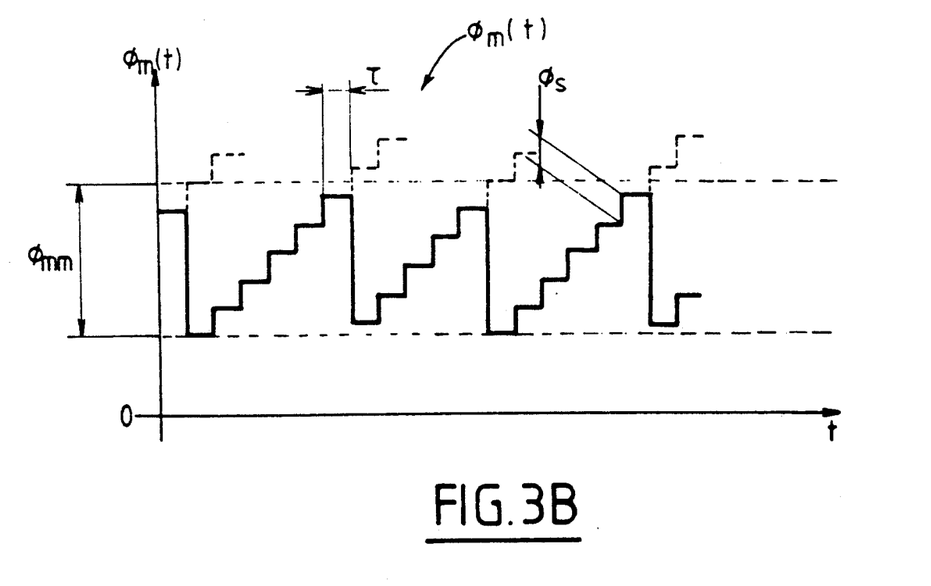

The digital electronic means 7 comprise an analog-digital converter 8 intended to digitize the signal emitted by the detector 3.

The dynamic of the analog-digital converter 8 can be relatively low in relation to the measurement dynamic as a whole. This dynamic is determined on the basis of the definition of the low limit and the high limit.

The low limit is determined so that the analog value corresponding to the least significant bit has a value less than or equal to the standard deviation of the noise in the signal coming from the detector. This condition prevents a blind zone corresponding to the least significant bit, and renders the sampling noise negligible relative to the initial noise in the analog signal. Moreover, an additional digital filtering leads in this case to the same improvement in the signal to noise ratio as in analog mode. According to a practical example, the sampling period is of the order of the time of transit in the coil, namely for example $\tau=0.5$ μs for 100 meters of fiber. The Shannon criterion therefore imposes a large pass band on the signal to be sampled: it has to be equal to $\frac{1}{2}\tau$, namely 1 MHz in this example. In such a pass band the noise is relatively large: typically a standard deviation of $10^{-3}$ of the bias feedback power which corresponds to a phase shift of about $10^{-3}$ radians in the interferometer. Hence it is sufficient, in order not to lose sensitivity and in order to be able later to improve the signal to noise ratio by filtering, that the least significant bit correspond to this phase shift.

For its part, the high limit must be at least greater than the peak to peak value of the noise, namely about 8 times its standard deviation and hence 3 bits would suffice for sampling the noise alone. However, account must also be taken of the inherent dynamic in the signal: in closed-loop mode the latter is slaved to zero and would not therefore a priori lay claim to any dynamic but in practice the slaving deviates from zero during sudden variations in the parameter to be measured, and the dynamic of the converter must be able to cope with these deviations. These variations therefore define the number of necessary bits. In practice 8 to 12 bits are sufficient at converter level, whilst after digital filtering the dynamic of the measured parameter can be greater than 20 bits.

The clock 21 drives all of these components.

A digital processing system 9 exploits the signal furnished by the analog-digital converter 8 by forming the difference between the samples corresponding to a bias modulation of the phase difference $\delta\Phi_b(t)=\Phi_{bm}$ and those corresponding to $\delta\Phi_b(t)=-\Phi_{bm}$. It is followed by a servo-loop integrating digital filter 10 fed by the signal leaving the digital processing system 9 and furnishing, after elimination of the bias modulation, a signal representing the measured parameter.

A register 11 receives the signal leaving the servo-loop digital filter and furnishes a signal which is a function of the measured parameter, which can be used for any desired external use.

The unit 20 produces the negative-feedback modulating signal $\Phi_m(t)$ on the basis of the value of the measured parameter.

A modulation generator 12 produces the bias modulating signal $\Phi_b(t)$.

The adder 13 comprises two inputs and one output. Its first input is fed by a negative-feedback signal which is a function of the measured parameter produced by the register 11 and the unit 20, and its second input is fed by the modulating signal produced by the generator 12. Its output signal is therefore $\Phi_m(t)+\Phi_b(t)$.

A digital-analog converter 14 fed by the output signal from the adder 13 controls the phase modulator 4 via the gain amplifier 15. The signal produced by the generator 12 ensures the operating of the bias setting system, that is to say an approximately linear dependence between the phase shift introduced between the two counter-propagating waves circulating in the interferometer, and the signal produced in the detector 3.

Figure 4A:
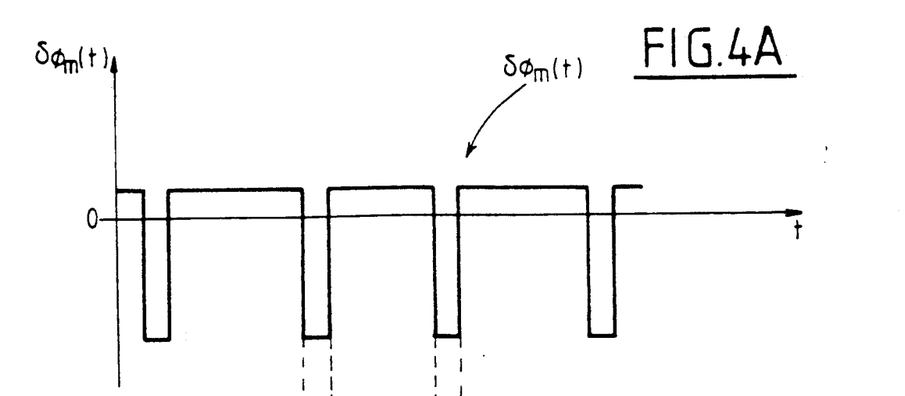
Figure 4B:
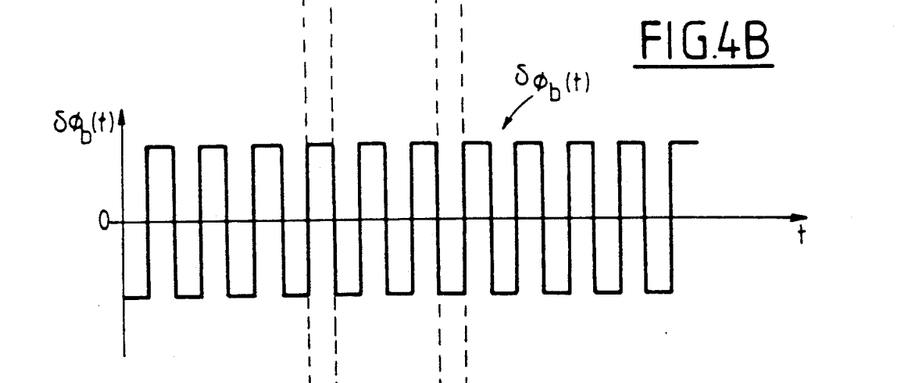
Figure 4C:
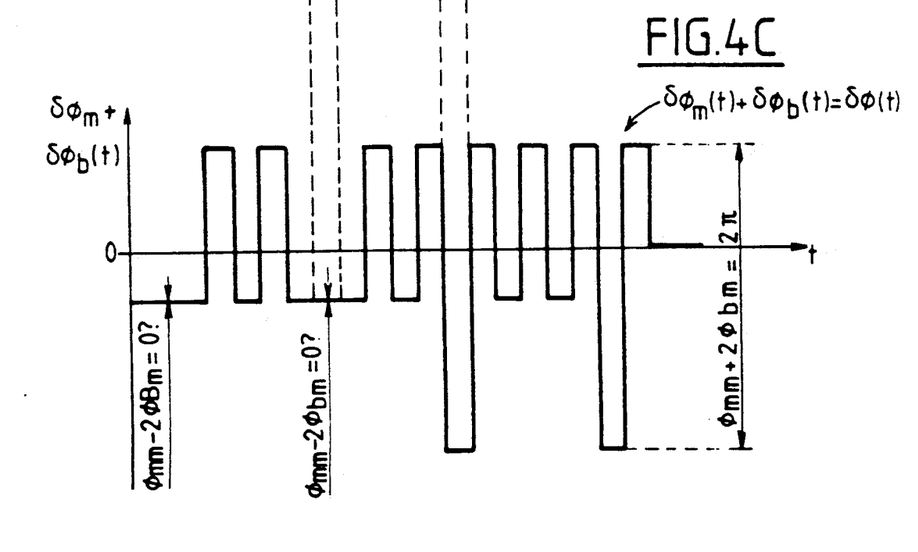

In a first embodiment (FIG. 4), in normal operation, the processing system 7 generates the bias modulating signal $\Phi_b(t)$, and the negative-feedback modulating signal $\Phi_m(t)$ composed of steps of duration $\tau$ of amplitude $\Phi_s$. $\Phi_b(t)$ and $\Phi_m(t)$ are in phase, that is to say they are simultaneously constant for the same interval of time of duration $\tau$.

The bias signal creates in the interferometer a bias modulation $\delta\Phi_b(t)=\Phi_b(t)-\Phi_b(t-\tau)$ for the phase difference. This modulation $\delta\Phi_b(t)$ varies in gating mode between $+\Phi_{bm}$ and $-\Phi_{bm}$, with a period of $2\tau$.

The negative-feedback signal $\Phi_m(t)$ creates a constant phase difference $\delta\Phi_m(t)$ equal to $a\Phi_s$ for steps of duration $\tau/a$ (where a is an integer greater than or equal to 1). However, through overflow of the digital register with dynamic $\Phi_{mm}$, the ramp $\Phi_m(t)$ falls back. For a time $\tau$ after this fall-back, the negative-feedback modulation of the phase difference $\delta\Phi_m(t)=\Phi_m(t)-\Phi_m(t-\tau)$ becomes equal to $a\Phi_s-\Phi_{mm}$ instead of $a\Phi_s$. It is known that, in order to prevent parasitic signals, it is sufficient for $\Phi_{mm}$ to correspond to $2\pi$, the periodicity of the interference. It has been observed that this known condition is not strictly necessary and that it is advantageous to reduce the value of this fall-back and hence limit the power consumed in the modulator and the associated thermal dissipation. In fact, this fall-back $\Phi_{mm}$ is associated with the bias modulating signal $\Phi_b(t)$. Adopting the case where a=1 for example, that is to say where the steps have a duration $\tau$, it has been observed that the phase difference $\delta\Phi_b(t)+\delta\Phi_m(t)$ takes, on either side of a fall-back, the values:

$$\delta\Phi_1 = \Phi_s + \Phi_{bm} \text{ and } \delta\Phi_2 = \Phi_s - \Phi_{bm} - \Phi_{mm}$$

or else $$\delta\Phi'_1 = \Phi_s - \Phi_{bm} \text{ and } \delta\Phi'_2 = \Phi_s + \Phi_{bm} - \Phi_{mm}$$

The difference between these values is therefore respectively:

$$\delta\Phi_1-\delta\Phi_2=\Phi_{mm}+2\Phi_{bm}$$

or else:

$$\delta\Phi'_1 - \Phi'_2 = \delta\Phi_{mm} - 2\Phi_{bm}.$$

It has been observed that, by choosing $\Phi_{mm} = 2\Phi_{bm}$ in the design of the logic processing circuit, it is ensured that $\delta\Phi'_1 - \delta\Phi'_2 = 0$ which prevents any parasitic signal in this case. It is also possible to slave $\delta\Phi_1 - \delta\Phi_2$ and hence $\Phi_{mm} + 2\Phi_{bm}$ about $2\pi$, in order to prevent parasitic signals in the second case and in order also to slave the gain of the modulating chain. This can be performed with a processing system 16 which produces the difference between the signal sampled by the converter 8 before the fall-back and that sampled after. This difference furnishes an error signal which cancels out when $\delta\Phi_1 - \delta\Phi_2 = \Phi_{mm} + 2\Phi_{bm} = 2n\pi$.

This error signal formulated by the system 16 is sent to a second servo-loop integrating filter 17. The digital signal issuing from this digital filter is then restored to analog mode in a second digital-analog converter 18 which controls the gain of the amplifier 15 (as represented in FIG. 2) or else the reference voltage of the converter 14 (not represented). This second loop slaves the gain of the modulating chain and therefore leads to ensuring an accurate measurement of the value of the step $\Phi_s$ generated in the first negative-feedback loop. With this step $\Phi_s$ being opposed to the phase difference $\delta\Phi_p/a$ depending on the parameter to be measured, this leads to an accurate measurement of the latter.

Figure 5A:
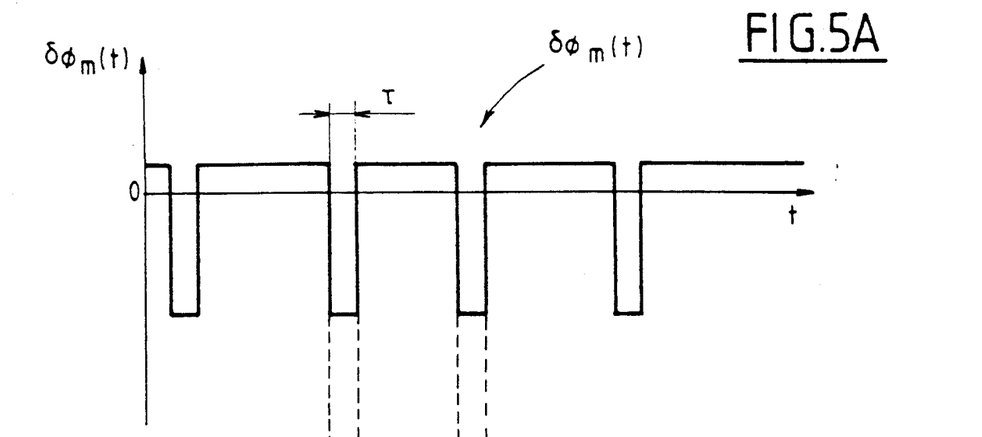
Figure 5B:
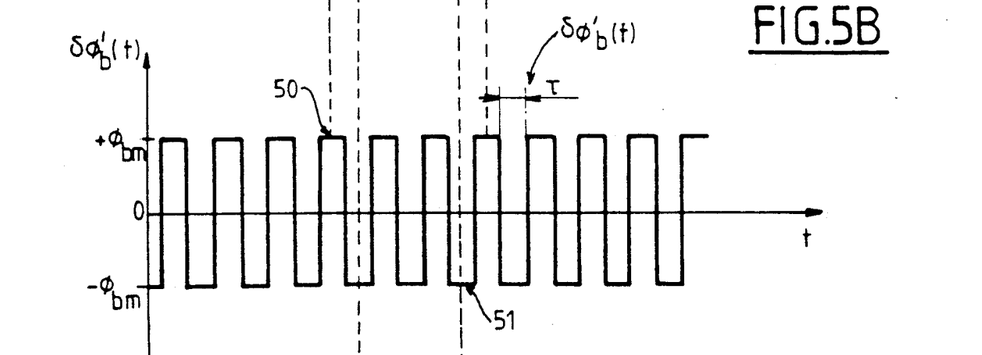
Figure 5C:
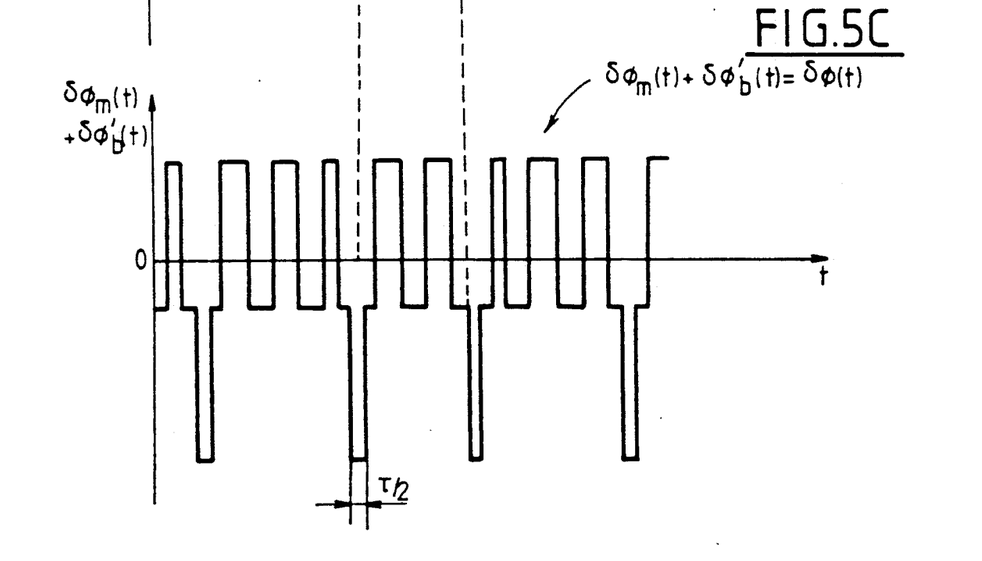

In a second embodiment (FIG. 5) the processing system 7 generates the bias modulating signal $\Phi_b(t)$ and the negative-feedback modulating signal $\Phi_m(t)$ composed of steps of duration $\tau$, of amplitude $\Phi_s$, and the synchronizing of $\Phi_m(t)$ with $\Phi_b(t)$ is delayed by $\tau/2$.

The bias signal creates in the interferometer a bias modulation $\delta\Phi_b(t) = \Phi_b(t) - \Phi_b(t-\tau)$ of the phase difference. This modulation $\delta\Phi_b(t)$ varies in the gating mode between $+\Phi_{bm}$ and $-\Phi_{bm}$, with a period of $2\tau$.

The negative-feedback signal $\Phi_m(t)$ creates a constant phase difference $\delta\Phi_m(t)$ equal to $\Phi_s$ for steps of duration $\tau$. However, through overflow of the digital register with dynamic $\Phi_{mm}$, the ramp $\Phi_m(t)$ falls back. For a time $\tau$ after this fall-back the negative-feedback modulation of the phase difference $\delta\Phi_m(t) = \Phi_m(t) - \Phi_m(t-\tau) = a\Phi_s - \Phi_{mm}$ instead of to $\Phi_s$ before this fall back.

As a result of the $\tau/2$ synchronization delay between $\Phi_b(t)$ and $\Phi_m(t)$, the fall-back of $\Phi_m(t)$ takes place in the middle of the $+\Phi_{bm}$ level or else in the middle of the $-\Phi_{bm}$ level of $\delta\Phi_b(t)$ (labeled 50 and 51 in FIG. 5B). For a duration $\tau$ before the fall-back, $\delta\Phi(t)$ still takes 2 values each of duration $\tau/2$:

$$\delta\Phi_1 = \Phi_s + \Phi_{bm}$$

$$\delta\Phi'_1 = \Phi_s - \Phi_{bm}$$

For a duration $\tau$ after the fall-back, $\delta\Phi(t)$ still takes 2 values each of duration $\tau/2$:

$$\delta\phi_2 = \Phi_s - \Phi_{bm} - \Phi_{mm}$$

$$\delta\Phi'_2 = \Phi_s + \Phi_{bm} - \Phi_{mm}$$

If the fall-back takes place in the middle of the $+\Phi_{bm}$ level, the 4 successive states of $\delta\Phi(t)$ of duration $\tau/2$ surrounding this fall-back will be:

$$\delta\Phi'_1, \delta\Phi_1, \delta\Phi'_2 \text{ and } \delta\Phi_2$$

If the fall-back takes place in the middle of the $-\Phi_{bm}$ level, the 4 successive states of $\delta\Phi(t)$ of duration $\tau/2$ surrounding this fall-back will then be:

$$\delta\Phi_1, \delta\Phi'_1, \delta\Phi_2 \text{ and } \delta\Phi'_2$$

It has been observed that by choosing $\Phi_{mm} = 2\Phi_{bm}$ the processing system 16 had to carry out the operation:

sample 1 + sample 2 − sample 3 − sample 4.

In both cases, this operation generates an error signal which cancels out when:

$$\delta\Phi_1 - \delta\Phi_2 = \Phi_{mm} + 2\Phi_{bm} = 2n\tau$$

since $\delta\Phi'_1 - \delta\Phi'_2 = 0$ when $\Phi_{mm} = 2\Phi_{bm}$

This operation therefore furnishes an error signal analogous to that obtained in the first embodiment described with reference to FIG. 4.

This error signal formulated by the system 16 is processed in the same manner as in the embodiment described previously, in such a way as to slave the gain of the modulating chain.

We note that in this second embodiment, the sampling of the signal coming from the detector must take place with a period $\tau/2$, and not $\tau$.

The measuring device of the invention is particularly well suited to constructing a rate gyro. In this case, the measured parameter is the speed of rotation of the interferometer about its axis.

This rate gyro advantageously comes into the construction of inertial stabilization or navigation systems.

Such an arrangement is likewise well suited to constructing the electric current and magnetic field measuring device, by profiting from the Faraday effect.

We claim:

1. A fiber optic measuring device in which variation in a measured parameter engenders a phase difference between two waves, the device comprising:
   a) a quasi-monochromatic light source;
   b) a preferably monomode SAGNAC ring interferometer in which two counter-propagating waves propagate, the propagation time of the waves between their splitting and their recombining being $\tau$;
   c) a detector;
   d) a phase modulator; and
   e) electronic means comprising a processing system furnishing a signal which is a function of the measured parameter, the electronic means controlling the phase modulator, wherein:
   the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;
   $\Phi_{bm}$ and $\Phi_{mm}$ are slaved to $2\Phi_{bm} + \Phi_{mm} = 2n\pi$ (where n is an integer);
   the response to the singular phase shift introduced during the fall-back of the negative-feedback signal is for this slaving and hence used to keep the gain of the modulation chain constant; and the electronic means negative-feedback controls the phase modulator as a function of the signal received from the detector so that (a) the variation in the demodulated error signal as a function of the phase difference in the neighborhood of zero is approximately linear, and (b) this phase difference is kept null and furnishing, by exploiting the modulating signal, a signal which is a function of the variation in the measured parameter;

said electronic means further comprising:

a clock synchronizing all the components of the electronic means;

an analog-digital converter for digitizing the signal emitted by the detector, the analog-digital converter being specified so that the analog value of its least significant bit has a value less than or equal to the standard deviation of the noise in the signal coming from the detector;

a servo-loop digital filter, fed by the signal leaving a digital processing system, furnishing a signal representing the measured parameter;

a register receiving the signal leaving the servo-loop digital filter and furnishing a signal which is a function of the measured parameter for any desired external use;

an accumulator fed by the signal leaving the register, generating a negative-feedback signal from the measured parameter, $\Phi_m(t)$;

a modulation generator producing a modulating signal $\Phi_b(t)$;

an adder comprising two inputs and one output, its first input being fed by the signal which is a function of the measured parameter produced by the register and the accumulator, its second input being fed by the modulating signal;

a digital-analog converter fed by the output signal from the adder and controlling the phase modulator via a gain amplifier;

a processing system which produces the difference between the signal sampled by the converter before the fall-back and that sampled after;

a second servo-loop integrating filter receiving the signal issuing from the processing system; and a second analog-digital converter which controls the gain of the amplifier.

2. The fiber optic measuring device as claimed in claim 1, wherein $\Phi_b(t)$ is delayed by $\tau/2$ relative to $\Phi_m(t)$.

3. The fiber optic measuring device as claimed in claim 1, wherein $\Phi_{bm} = \pi/2$ and $\Phi_{mm} = \pi$.

4. A fiber optic measuring device in which variation in a measured parameter engenders a phase difference between two waves, the device comprising:

a) a quasi-monochromatic light source;
b) a preferably monomode SAGNAC ring interferometer in which two counter-propagating waves propagate, the propagation time of the waves between their splitting and their recombining being $\tau$;
c) a detector;
d) a phase modulator; and
e) electronic means comprising a processing system furnishing a signal which is a function of the measured parameter, the electronic means controlling the phase modulator, wherein:

the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;

$\Phi_{bm}$ and $\Phi_{mm}$ are slaved to $2\Phi_{bm} + \Phi_{mm} = 2n\pi$ (where n is an integer);

the response to the singular phase shift introduced during the fall-back of the negative-feedback signal is for this slaving and hence used to keep the gain of the modulation chain constant; and the electronic means negative-feedback controls the phase modulator as a function of the signal received from the detector so that (a) the variation in the demodulated error signal as a function of the phase difference in the neighborhood of zero is approximately linear, and (b) this phase difference is kept null and furnishing, by exploiting the modulating signal, a signal which is a function of the variation in the measured parameter;

said electronic means further comprising:

a clock synchronizing all the components of the electronic means;

an analog-digital converter for digitizing the signal emitted by the detector, the analog-digital converter being specified so that the analog value of its least significant bit has a value less than or equal to the standard deviation of the noise in the signal coming from the detector;

a servo-loop digital filter, fed by the signal leaving a digital processing system, furnishing a signal representing the measured parameter;

a register receiving the signal leaving the servo-loop digital filter and furnishing a signal which is a function of the measured parameter for any desired external use;

an accumulator fed by the signal leaving the register, generating a negative-feedback signal from the measured parameter, $\Phi_m(t)$;

a modulation generator producing a modulating signal $\Phi_b(t)$;

an adder comprising two inputs and one input, its first input being fed by the signal which is a function of the measured parameter produced by the register and the accumulator, its second input being fed by the modulating signal;

a digital-analog converter fed by the output signal from the adder and controlling the phase modulator via a gain amplifier;

a processing system which produces the difference between the signal sampled by the converter before the fall-back and that sampled after;

a second servo-loop integrating filter receiving the signal issuing from the processing system; and a second analog-digital converter which controls the gain of the amplifier;

wherein $\Phi_b(t)$ and $\Phi_m(t)$ are in phase, $\Phi_{bm} = \pi/2$ and $\Phi_{mm} = \pi$.

5. A fiber optic rate gyro in which the variation in a speed of rotation engenders a phase difference between two waves, the fiber optic rate gyro comprising:

a) a quasi-monochromatic light source;

b) a preferably monomode SAGNAC ring interferometer in which two counter-propagating waves propagate, the propagation time of the waves between their splitting and their recombining being $\tau$;

c) a detector;

d) a phase modulator; and e) electronic means comprising a processing system furnishing a signal which is a function of the measured parameter, the electronic means controlling the phase modulator, wherein:

the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;

$\Phi_{bm}$ and $\Phi_{mm}$ are slaved to $2\Phi_{bm}+\Phi_{mm}=2n\tau$ (where n is an integer);

the response to the singular phase shift introduced during the fall-back of the negative-feedback signal is for this slaving and hence used to keep the gain of the modulation chain constant; and the electronic means negative-feedback controls the phase modulator as a function of the signal received from the detector so that (a) the variation in the demodulated error signal as a function of the phase difference in the neighborhood of zero is approximately linear, and (b) this phase difference is kept null and furnishing, by exploiting the modulating signal, a signal which is a function of the variation in the measured parameter;

said electronic means further comprising:

a clock synchronizing all the components of the electronic means;

an analog-digital converter for digitizing the signal emitted by the detector, the analog-digital converter being specified so that the analog value of its least significant bit has a value less than or equal to the standard deviation of the noise in the signal coming from the detector;

a servo-loop digital filter, fed by the signal leaving a digital processing system, furnishing a signal representing the measured parameter;

a register receiving the signal leaving the servo-loop digital filter and furnishing a signal which is a function of the measured parameter for any desired external use;

an accumulator fed by the signal leaving the register, generating a negative-feedback signal from the measured parameter, $\Phi_m(t)$;

a modulation generator producing a modulating signal $\Phi_b(t)$;

an adder comprising two inputs and one input, its first input being fed by the signal which is a function of the measured parameter produced by the register and the accumulator, its second input being fed by the modulating signal;

a digital-analog converter fed by the output signal from the adder and controlling the phase modulator via a gain amplifier;

a processing system which produces the difference between the signal sampled by the converter before the fall-back and that sampled after;

a second servo-loop integrating filter receiving the signal issuing from the processing system; and a second analog-digital converter which controls the gain of the amplifier.

6. The fiber optic rate gyro as claimed in claim 5, wherein $\Phi_b(t)$ is delayed by $\tau/2$ relative to $\Phi_m(t)$.

7. The fiber optic rate gyro as claimed in claim 7, wherein $\Phi_{bm}=\pi/2$ and $\Phi_{mm}=\pi$.

8. A fiber optic rate gyro in which the variation in a rotation measured engenders a phase difference between two waves, the fiber optic rate gyro comprising:

a) a quasi-monochromatic light source;

b) a preferably monomode SAGNAC ring interferometer in which two counter-propagating waves propagate, the propagation time of the waves between their splitting and their recombining being $\tau$;

c) a detector;

d) a phase modulator; and e) electronic means comprising a processing system furnishing a signal which is a function of the measured parameter, the electronic means controlling the phase modulator, wherein:

the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;

$\Phi_{bm}$ and $\Phi_{mm}$ are slaved to $2\Phi_{bm}+\Phi_{mm}=2n\tau$ (where n is an integer);

the response to the singular phase shift introduced during the fall-back of the negative-feedback signal is for this slaving and hence used to keep the gain of the modulation chain constant; and the electronic means negative-feedback controls the phase modulator as a function of the signal received from the detector so that (a) the variation in the demodulated error signal as a function of the phase difference in the neighborhood of zero is approximately linear, and (b) this phase difference is kept null and furnishing, by exploiting the modulating signal, a signal which is a function of the variation in the measured parameter;

said electronic means further comprising:

a clock synchronizing all the components of the electronic means;

an analog-digital converter for digitizing the signal emitted by the detector, the analog-digital converter being specified so that the analog value of its least significant bit has a value less than or equal to the standard deviation of the noise in the signal coming from the detector;

a servo-loop digital filter, fed by the signal leaving a digital processing system, furnishing a signal representing the measured parameter;

a register receiving the signal leaving the servo-loop digital filter and furnishing a signal which is a function of the measured parameter for any desired external use;

an accumulator fed by the signal leaving the register, generating a negative-feedback signal from the measured parameter, $\Phi_m(t)$;

a modulation generator producing a modulating signal $\Phi_b(t)$;

an adder comprising two inputs and one output, its first input being fed by the signal which is a function of the measured parameter produced by the register and the accumulator, its second input being fed by the modulating signal;

a digital-analog converter fed by the output signal from the adder and controlling the phase modulator via a gain amplifier;

a processing system which produces the difference between the signal sampled by the converter before the fall-back and that sampled after;

a second servo-loop integrating filter receiving the signal issuing from the processing system; and a second analog-digital converter which controls the gain of the amplifier;

wherein $\Phi_b(t)$ and $\Phi_m(t)$ are in phase, $\Phi_{bm} = \pi/2$ and $\Phi_{mm} = \pi$.

9. An inertial stabilization or navigation system comprising at least one rate optic fiber gyro in which variation in rotation engenders a phase difference between two waves, the system comprising:

a) a quasi-monochromatic light source;

b) a preferably monomode SAGNAC ring interferometer in which two counter-propagating waves propagate, the propagation time of the waves between their splitting and their recombining being $\tau$;

c) a detector;

d) a phase modulator; and e) electronic means comprising a processing system furnishing a signal which is a function of the measured parameter, the electronic means controlling the phase modulator, wherein:

the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;

$\Phi_{bm}$ and $\Phi_{mm}$ are slaved to $2\Phi_{bm} + \Phi_{mm} = 2n\pi$ (where n is an integer);

the response to the singular phase shift introduced during the fall-back of the negative-feedback signal is for this slaving and hence used to keep the gain of the modulation chain constant.

10. A fiber optic magnetic field and current sensor in which variation of a magnetic field and current engenders a phase difference between two waves, the sensor comprising:

a) a quasi-monochromatic light source;

b) a preferably monomode SAGNAC ring interferometer in which two counter-propagating waves propagate, the propagation time of the waves between their splitting and their recombining being $\tau$;

c) a detector;

d) a phase modulator; and e) electronic means comprising a processing system furnishing a signal which is a function of the measured parameter, the electronic means controlling the phase modulator, wherein:

the control signal for the modulator is the superposition of (a) a first, periodic gating, bias signal $\Phi_b(t)$ with period $2\tau$ and amplitude $\Phi_{bm}$, and (b) a second, staircase, negative-feedback signal $\Phi_m(t)$ synchronized with $\Phi_b(t)$, each step of which has a duration equal to $\tau$ or to one of its sub-multiples, and an amplitude $\Phi_s$, which is a function of the value of the measured parameter and which falls back to zero when its amplitude exceeds a predetermined value $\Phi_{mm}$;

$\Phi_{bm}$ and $\Phi_{mm}$ are slaved to $2\Phi_{bm} + \Phi_{mm} = 2n\pi$ (where n is an integer);

the response to the singular phase shift introduced during the fall-back of the negative-feedback signal is for this slaving and hence used to keep the gain of the modulation chain constant.

* * * * *